US007696076B2

(12) United States Patent
Jung et al.

(10) Patent No.: US 7,696,076 B2
(45) Date of Patent: Apr. 13, 2010

(54) METHOD OF FABRICATING FLASH MEMORY DEVICE

(75) Inventors: Woo Yung Jung, Seoul (KR); Choi Dong Kim, Kyeongki-do (KR); Sang Min Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 161 days.

(21) Appl. No.: 11/955,349

(22) Filed: Dec. 12, 2007

(65) Prior Publication Data
US 2008/0280431 A1 Nov. 13, 2008

(30) Foreign Application Priority Data
May 11, 2007 (KR) ............... 10-2007-0045993

(51) Int. Cl.
*H01L 21/31* (2006.01)
(52) U.S. Cl. .................. 438/593; 438/763; 438/942
(58) Field of Classification Search .................. None
See application file for complete search history.

(56) References Cited

U.S. PATENT DOCUMENTS

| | | | |
|---|---|---|---|
| 6,194,271 B1 * | 2/2001 | Lin et al. | 438/259 |
| 6,197,639 B1 * | 3/2001 | Lee et al. | 438/258 |
| 6,245,614 B1 * | 6/2001 | Hsieh | 438/267 |
| 6,294,480 B1 * | 9/2001 | Pradeep et al. | 438/763 |
| 6,559,017 B1 * | 5/2003 | Brown et al. | 438/302 |
| 6,605,509 B1 * | 8/2003 | Hsieh | 438/264 |
| 6,635,918 B1 * | 10/2003 | Narui et al. | 257/311 |
| 7,034,408 B1 | 4/2006 | Schloesser | |
| 7,341,912 B2 * | 3/2008 | Choi et al. | 438/257 |
| 2001/0019506 A1 * | 9/2001 | Chen | 365/200 |
| 2005/0179079 A1 * | 8/2005 | Wu | 257/316 |
| 2005/0186739 A1 * | 8/2005 | Wang et al. | 438/267 |
| 2006/0211260 A1 * | 9/2006 | Tran et al. | 438/763 |
| 2007/0238053 A1 * | 10/2007 | Hashimoto | 430/313 |
| 2007/0269722 A1 * | 11/2007 | Lin | 430/5 |
| 2007/0285983 A1 * | 12/2007 | Ishii et al. | 365/185.13 |
| 2008/0081412 A1 * | 4/2008 | Jung | 438/257 |
| 2008/0296737 A1 * | 12/2008 | Weis et al. | 257/623 |

FOREIGN PATENT DOCUMENTS

| | | |
|---|---|---|
| KR | 100684888 B1 | 2/2007 |
| KR | 1020070059324 A | 6/2007 |
| KR | 1020080087520 | 10/2008 |

* cited by examiner

*Primary Examiner*—Bradley K Smith
*Assistant Examiner*—Mohammad Choudhry
(74) *Attorney, Agent, or Firm*—Townsend and Townsend and Crew LLP

(57) ABSTRACT

The present invention relates to a method of fabricating a flash memory device. In a method according to an aspect of the present invention, a first hard mask film is formed over a semiconductor laminate. A plurality of first hard mask patterns are formed by etching an insulating layer for a hard mask. Spacers are formed on top surfaces and sidewalls of the plurality of first hard mask patterns. A second hard mask film is formed over a total surface including the spacers. Second hard mask patterns are formed in spaces between the spacers by performing an etch process so that a top surface of the spacers is exposed. The spacers are removed. Accordingly, gate patterns can be formed by employing hard mask patterns having a pitch of exposure equipment resolutions or less.

16 Claims, 2 Drawing Sheets

METHOD OF FABRICATING FLASH MEMORY DEVICE

CROSS-REFERENCES TO RELATED APPLICATIONS

The present application claims priority to Korean patent application number 10-2007-45993, filed on May 11, 2007, which is incorporated by reference in its entirety.

BACKGROUND OF THE INVENTION

The present invention generally relates to methods for fabricating flash memory devices and, more particularly, to methods for fabricating flash memory devices with increased memory cell density In general, a semiconductor memory device is largely classified as volatile memory or non-volatile memory.

Volatile memory includes Random Access Memory (RAM), such as Dynamic Random Access Memory (DRAM) and Static Random Access Memory (SRAM). Volatile memory has the property that data can be input and retained while the memory is being powered, but the data becomes volatile and cannot be retained when the memory is not being powered.

With DRAM memory, the transistor is responsible for the switch function and the capacitor is responsible for the data storage function. If power is not supplied, internal data within the DRAM are automatically lost. In addition, the SRAM has the transistor structure of a flip flop type. Data are stored according to the difference between the degree of driving between the transistors. Internal data within SRAM are also automatically lost when the memory is not being powered.

In contrast, non-volatile memory does not lose stored data even when the memory is not being powered has been developed. Examples of non-volatile memory include Programmable Read Only Memory (PROM), Erasable Programmable Read Only Memory (EPROM), and Electrically Erasable Programmable Read Only Memory (EEPROM).

A flash memory device is an advanced type of EEPROM device that can be erased electrically at high speed without being removed from a circuit board. A flash memory device is advantageous in that it has a simple memory cell structure, has low manufacturing cost per memory, and can retain data even when the memory is not being powered.

In general, memory cells of a flash memory device are formed by laminating a tunnel insulating film, a conductive layer for a floating gate, a dielectric layer, a conductive layer for a control gate, and a metal gate layer over a semiconductor substrate. The resulting semiconductor laminate is subsequently etched employing a hard mask pattern, thus forming a plurality of memory cell gate patterns and select transistor gate patterns at the same time.

As semiconductor devices become more highly integrated, semiconductor elements must be formed within an increasingly limited area. As a result, the size of a memory cell gate is gradually reduced. However, a problem exists in that using a hard mask formation process for forming memory cells becomes increasingly difficult as the size of memory cells decreases.

One notable difficulty occurs during the formation of memory cells for a flash memory device having a line width of 60 nm or less. Where a photolithography process is performed using ArF exposure having a wavelength of 193 nm, deformation of the memory cell pattern often occurs. As a result, not only must the fabrication process used be capable of producing memory cells meeting existing requirements (formation of an accurate pattern, a vertical profile, and so on), the fabrication process must also avoid producing deformed memory cell patterns.

BRIEF SUMMARY OF THE INVENTION

The present invention relates to methods for fabricating flash memory devices with increased memory cell density. The present invention may provide for the fabrication of memory cell patterns having a pitch of exposure equipment resolutions or less.

In one aspect, the present invention provides a method for fabricating a flash memory device from a semiconductor laminate. The method includes forming a first hard mask film over a semiconductor substrate, forming a plurality of first hard mask patterns by etching regions of the hard mask, forming spacers on top surfaces and sidewalls of the plurality of first hard mask patterns, forming a second hard mask film over a total surface including the spacers, forming second hard mask patterns in spaces between the spacers by performing an etch process so that a top surface of the spacers is exposed, and removing the spacers.

In one embodiment, the first hard mask film comprises a first layer and a second layer, where the first layer comprises amorphous carbon and the second layer comprises SiON, and where the first layer and the second layer are sequentially laminated.

In another embodiment, the spacers comprise amorphous carbon.

In a further embodiment, the second hard mask film may be formed from Silicon on Glass.

In a further embodiment, the removal of the spacers may be performed by a dry etch process.

In another aspect, the present invention provides a method for fabricating a flash memory device from a semiconductor substrate, where the flash memory device has a memory cell region and a select transistor region. First, a semiconductor laminate is fabricated by laminating a tunnel insulating layer, a floating-gate conductive layer, a dielectric layer, a control-gate layer, a metal layer, and a first hard mask film on a semiconductor substrate. The semiconductor laminate is etched to form first hard mask patterns, which have an exposed top surface and sidewalls. Spacers are formed on the exposed top surfaces and sidewalls of the first hard mask patterns. A second hard mask film is applied over the spacers and exposed surfaces of the semiconductor laminate. A region of the second hard mask film is removed over the select transistor region. A plurality of second hard mask patterns is formed in the spaces between the spacers by removing a portion of the second hard mask film by way of etching so that a top surface of the spacers is exposed. The spacers are then removed. Finally, sequential etching of the metal layer, the control-gate conductive layer, the dielectric layer, the floating-gate conductive layer, and the tunnel insulating layer is performed.

In one embodiment, the first hard mask film comprises a first layer and a second layer, where the first layer comprises amorphous carbon, and the second layer comprises SiON, and where the first layer and the second layer are sequentially laminated.

In another embodiment, the spacers comprise amorphous carbon.

In a further embodiment, the second hard mask film may be formed from Silicon on Glass.

In another aspect, the present invention provides a method for fabricating a flash memory device from a semiconductor substrate, where the flash memory device has a memory cell region and a select transistor region. First, a semiconductor laminate is fabricated by laminating a tunnel insulating layer, a floating-gate conductive layer, a dielectric layer, a control-gate layer, a metal layer, and a first hard mask film on a semiconductor substrate. The semiconductor laminate is etched to form first hard mask patterns, which have an exposed top surface and sidewalls. Spacers are formed on the exposed top surfaces and sidewalls of the first hard mask patterns. A second hard mask film is applied over the spacers and exposed surfaces of the semiconductor laminate within the memory cell region. A plurality of second hard mask patterns is formed in the spaces between the spacers by removing a portion of the second hard mask film by way of etching so that a top surface of the spacers is exposed. The spacers are then removed. Finally, sequential etching of the metal layer, the control-gate conductive layer, the dielectric layer, the floating-gate conductive layer, and the tunnel insulating layer is performed.

In one embodiment, the first hard mask film comprises a first layer and a second layer, where the first layer comprises amorphous carbon, and the second layer comprises SiON, and where the first layer and the second layer are sequentially laminated.

In another embodiment, the spacers comprise amorphous carbon.

In a further embodiment, the second hard mask film may be formed from Silicon on Glass.

DESCRIPTION OF SPECIFIC EMBODIMENTS

The present invention will now be described in connection with preferred embodiments with reference to the accompanying drawings.

However, the present invention is not limited to the disclosed embodiments, but may be implemented in various manners. The embodiments are provided to allow those having ordinary skill in the art to understand the scope of the present invention. It will be apparent to those skilled in the art that various substitutions, modifications, and changes may be made thereto without departing from the scope of the invention. Hence, the scope of the present invention should be defined by the appended claims.

FIGS. 1 to 6 are sectional views illustrating a method of fabricating a flash memory device according to an embodiment of the present invention.

Figure 1:
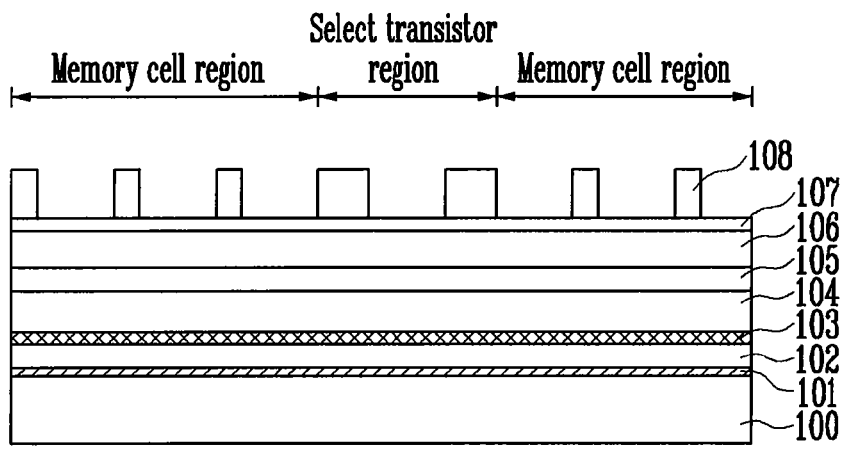
FIGS. 1 to 6 are sectional views illustrating a method of fabricating a flash memory device according to an embodiment of the present invention.

Referring to FIG. 1, a tunnel insulating film 101, a floating-gate conductive layer 102 (or first conductive layer), a dielectric layer 103, a control-gate conductive layer 104 (or second conductive layer), and a metal gate layer 105 are sequentially laminated over a semiconductor substrate 100. As illustrated, the semiconductor may comprise a memory cell region and a select transistor region.

A first insulating layer 106 for a first hard mask and a second insulating layer 107 for the first hard mask are sequentially laminated over the entire surface including the metal gate layer 105. The first insulating layer 106 may be formed from an amorphous carbon film and the second insulating layer 107 may be formed from SiON. The amorphous carbon film and the SiON film are transparent films. In one implementation, these films are not to be etched to expose the underlying layer. That is, a key open process for alignment can skip.

A photoresist material is coated on the second insulating layer 107 and an exposure and development process is then performed, thus forming photoresist patterns 108. A distance between the photoresist patterns 108 may be set to twice a distance between cell gates that are to be formed subsequently.

Figure 2:
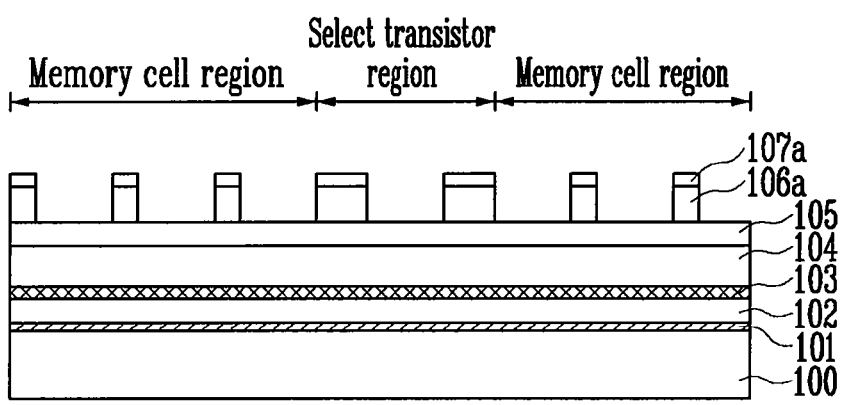

Referring to FIG. 2, the second insulating layer 107 and the first insulating layer 106 are etched by performing an etch process employing the photoresist patterns, thus forming first hard mask patterns 107a and 106a.

Figure 3:
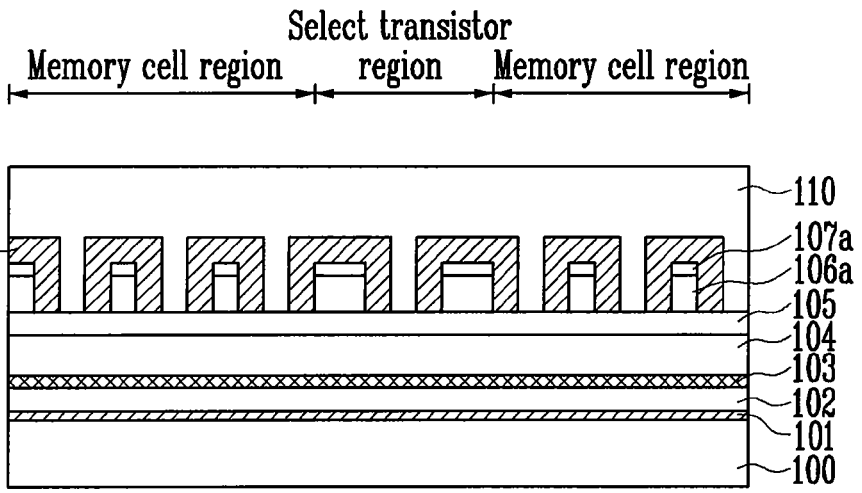

Referring to FIG. 3, spacers 109 are formed on sidewalls and top surfaces of the first hard mask patterns 107a and 106a. The spacer 109 may be formed from amorphous carbon. The amorphous carbon film may be formed through a cycle of deposition and etch method in which this cycle is performed a plurality of times within a chamber. The amorphous carbon film is formed using the deposition and etch method above. Each spacer 109 encloses one of the first hard mask patterns 106a and 107a and is spaced apart from an adjacent spacer. Each spacer has a substantially constant thickness; i.e., the vertical thickness over the top surface of the first hard mask pattern 106a, 107a is substantially the same as the lateral thickness defined from the sidewalls of the first hard mask pattern 106a, 107a. Each spacer, accordingly, has a height 112 extending from the semiconductor substrate 100 to the top of the spacer.

A third insulating layer 110 is formed over the entire surface of the metal gate layer 105 including the spacers 109. The third insulating layer 110 may be formed to gap fill the spaces between the spacers 109. The third insulating layer 110 may be formed from a SOG film.

Figure 4:
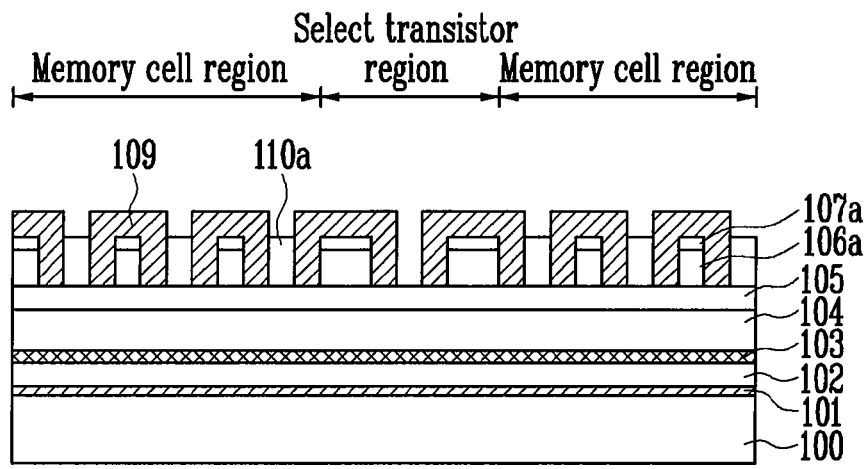

Referring to FIG. 4, the third insulating layer 110 formed in the spaces between the first hard mask patterns for forming select transistor gate patterns is removed using an etch process employing an etch mask. The third insulating layer 110 formed on regions where patterns will not be formed subsequently may be removed at the same time.

Thereafter, the third insulating layer 110 is etched by performing an etchback process such that a top surface of the spacers 109 is exposed. The etchback process may be performed so that a portion of the third insulating layer 110 remains in the spaces between the spacers 109, so second hard mask patterns 110a are formed in the spaces between the spacers 109.

Figure 5:
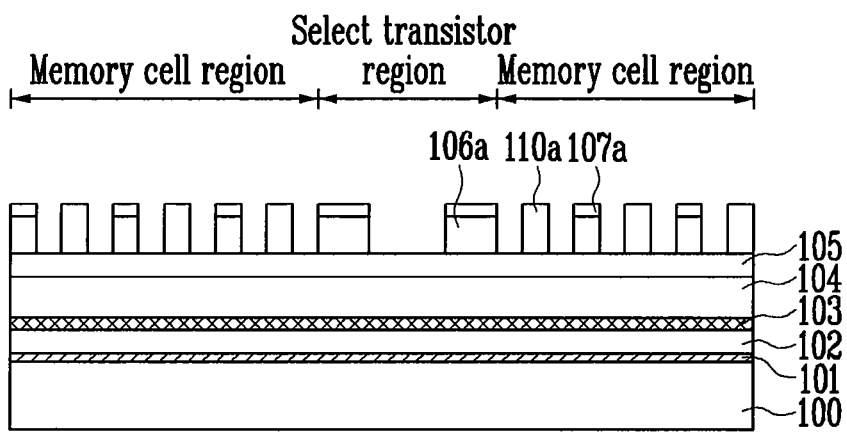

Referring to FIG. 5, the spacers are removed by performing an etch process. Thus, the first hard mask patterns 107a and 106a and the second hard mask patterns 110a are sequentially intersected and arranged. The spacers 109 may be removed using a dry etch process.

Figure 6:
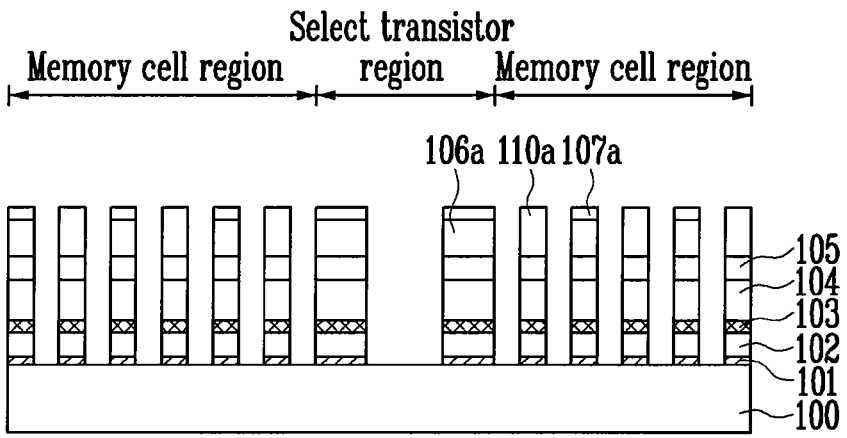

Referring to FIG. 6, the metal gate layer 105, the conductive layer 104 for the control gate, the dielectric layer 103, the conductive layer 102 for the floating gate, and the tunnel insulating film 101 are sequentially etched by performing an etch process employing the first hard mask patterns 107a and 106a and the second hard mask patterns 110a as an etch mask, thus forming a plurality of memory cell gate patterns and select transistor gate patterns.

According to the present invention, the first hard mask patterns 106a and 107a are formed using a first etch process, the spacers 109 are formed on the sidewalls of the first hard mask patterns 106a and 107a, and the second hard mask patterns 110a are formed between the spacers 109. Accordingly, gate patterns can be formed by employing hard mask patterns having a pitch of exposure equipment resolutions or less.

What is claimed is:

1. A method of fabricating a flash memory device, the method comprising:
   forming a first hard mask film over a semiconductor substrate;
   forming a plurality of first hard mask patterns by etching regions of the first hard mask film, where each first hard mask patterns comprises a top surface and a plurality of sidewalls;
   forming a plurality of spacers enclosing the first hard mask patterns, each spacer being spaced apart from an adjacent spacer;
   forming a second hard mask film over the spacers and between the spaces defined by the spacers;
   etching the second hard mask film until top surfaces of the spacers are substantially exposed, so that a plurality of second hard mask patterns is formed in the space defined by the spacers; and
   removing the spacers to obtain the first hard mask patterns and the second hard mask patterns in an alternating arrangement.

2. The method of claim 1, wherein the first hard mask film comprises a first layer and a second layer, where the first layer comprises amorphous carbon and the second layer comprises SiON, and where the first layer and the second layer are sequentially laminated.

3. The method of claim 1, wherein the spacers comprise amorphous carbon.

4. The method of claim 1, wherein the second hard mask film comprises Silicon on Glass.

5. The method of claim 1, wherein the removal of the spacers is performed using a dry etch process.

6. The method of claim 1, wherein the spacers have a vertical thickness that is substantially the same as a lateral thickness.

7. A method of fabricating a flash memory device, the method comprising:
   forming a tunnel insulating layer, a floating-gate conductive layer, a dielectric layer, a control-gate conductive layer, a metal layer, and a first hard mask film over a semiconductor substrate, the semiconductor substrate including a memory cell region and a select transistor region;
   forming a plurality of first hard mask patterns by etching regions of the first hard mask film;
   forming a plurality of spacers to cover each of the first hard mask patterns;
   forming a second hard mask film over a resulting structure after forming the spacers;
   removing the second hard mask film formed over the select transistor region;
   etching the second hard mask film until a top surface of the spacers is exposed, wherein the second hard mask film remains in a space between the spacers in the memory cell region;
   removing the spacers such that a plurality of second hard mask patterns are formed; and
   sequentially etching the metal layer, the control-gate conductive layer, the dielectric layer, the floating-gate conductive, and the tunnel insulating film by performing an etch process employing the first and second hard mask patterns.

8. The method of claim 7, wherein the first hard mask film comprises a first layer and a second layer, where the first layer comprises amorphous carbon and the second layer comprises SiON, and where the first and second layer are sequentially laminated.

9. The method of claim 7, wherein the spacers comprise amorphous carbon.

10. The method of claim 7, wherein the second hard mask film comprises Silicon on Glass.

11. The method of claim 7, wherein the removal of the spacers is performed using a dry etch process.

12. A method of fabricating a flash memory device, the method comprising:
    forming a tunnel insulating layer, a floating-gate conductive layer, a dielectric layer, a control-gate conductive layer, a metal layer, and a first hard mask film over a semiconductor substrate, the semiconductor substrate comprising a memory cell region and a select transistor region;
    forming a plurality of first hard mask patterns by etching regions of the first hard mask film, where each first hard mask patterns comprises a top surface and a plurality of sidewalls;
    forming a plurality of spacers enclosing the first hard mask patterns, each spacer being spaced apart from an adjacent spacer;
    forming a second hard mask film over the spacers and between the spaces defined by the spacers;
    etching the second hard mask film until top surfaces of the spacers are substantially exposed, so that a plurality of second hard mask patterns is formed in the space defined by the spacers; and
    removing the spacers to obtain the first hard mask patterns and the second hard mask patterns in an alternating arrangement,
    etching the metal layer, the control-gate conductive layer, the dielectric layer, the floating-gate conductive, and the tunnel insulating film by performing an etch process employing the first and second hard mask patterns.

13. The method of claim 12, wherein the first hard mask film comprises a first layer and a second layer, where the first layer comprises amorphous carbon and the second layer comprises SiON, and where the first and second layer are sequentially laminated.

14. The method of claim 12, wherein the spacers comprise amorphous carbon.

15. The method of claim 12, wherein the second hard mask film comprises Silicon on Glass.

16. The method of claim 12, wherein the removal of the spacers is performed using a dry etch process.

* * * * *